United States Patent
Von Blanckenhagen

(10) Patent No.: US 8,246,182 B2
(45) Date of Patent: Aug. 21, 2012

(54) REFLECTIVE OPTICAL ELEMENT AND METHOD FOR PRODUCTION OF SUCH AN OPTICAL ELEMENT

(75) Inventor: Gisela Von Blanckenhagen, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/051,782

(22) Filed: Mar. 18, 2011

(65) Prior Publication Data
US 2011/0228234 A1      Sep. 22, 2011

Related U.S. Application Data

(63) Continuation of application No. PCT/EP2009/006112, filed on Aug. 22, 2009.

(60) Provisional application No. 61/098,568, filed on Sep. 19, 2008.

(30) Foreign Application Priority Data

Sep. 19, 2008  (DE) .................. 10 2008 042 212

(51) Int. Cl.
*G03B 21/00*      (2006.01)
(52) U.S. Cl. .............. 353/122; 353/30; 353/31; 353/37; 353/98; 353/99; 353/121; 359/359
(58) Field of Classification Search .................. 353/30, 353/31, 37, 98, 99, 121, 122; 359/359, 361, 359/584, 586, 589, 577, 582, 590; 438/478–509, 438/584–688, 758–794; 204/192.1–192.15; 427/596, 554
See application file for complete search history.

(56) References Cited

U.S. PATENT DOCUMENTS

| | | | | |
|---|---|---|---|---|
| 5,200,230 A | * | 4/1993 | Poullos et al. | .................... 427/8 |
| 5,822,119 A | * | 10/1998 | Rasmussen et al. | .......... 359/515 |
| 6,011,646 A | | 1/2000 | Mirkarimi et al. | |
| 6,072,852 A | * | 6/2000 | Hudyma | ........................ 378/34 |
| 6,134,049 A | | 10/2000 | Spiller et al. | |
| 6,295,164 B1 | | 9/2001 | Murakami et al. | |

(Continued)

FOREIGN PATENT DOCUMENTS

DE          102 39 858 A1        3/2011

(Continued)

OTHER PUBLICATIONS

A. Patelli et al., "Ion bombardment effects on nucleation of sputtered Mo nano-crystals in Mo/B4C/Si multilayers", Surface & Coatings Technology 201 (2006) pp. 143-147.

(Continued)

*Primary Examiner* — Georgia Y Epps
*Assistant Examiner* — Sultan Chowdhury
(74) *Attorney, Agent, or Firm* — Sughrue Mion, PLLC

(57) ABSTRACT

In order to produce stress-reduced reflective optical elements (1) for an operating wave length in the soft X-ray and extreme ultraviolet wavelength range, in particular for use in EUV lithography, it is proposed to apply, between substrate (2) and a multilayer system (4) optimized for high reflectivity at the operating wavelength, a stress-reducing multilayer system (6) with the aid of particle-forming particles having an energy of 40 eV or more, preferably 90 eV or more. Resulting reflective optical elements are distinguished by low surface roughness, a low number of periods in the stress-reducing multilayer system and also high $\Gamma$ values of the stress-reducing multilayer system.

45 Claims, 6 Drawing Sheets

U.S. PATENT DOCUMENTS

| | | | |
|---|---|---|---|
| 6,485,884 B2 * | 11/2002 | Wolk et al. | 430/200 |
| 6,489,066 B2 | 12/2002 | Mirkanimi | |
| 6,632,583 B2 * | 10/2003 | Kunitomo et al. | 430/270.13 |
| 6,833,223 B2 * | 12/2004 | Shiraishi | 430/5 |
| 2002/0140886 A1 * | 10/2002 | Sugiura et al. | 349/113 |
| 2003/0008148 A1 * | 1/2003 | Bajt et al. | 428/408 |
| 2003/0039042 A1 | 2/2003 | Shiraishi | |
| 2003/0164998 A1 | 9/2003 | Mirkarimi et al. | |
| 2005/0100797 A1 | 5/2005 | Shoki et al. | |
| 2007/0091420 A1 | 4/2007 | Hosoya et al. | |
| 2007/0287076 A1 | 12/2007 | Masaki et al. | |
| 2008/0123073 A1 | 5/2008 | Shiraishi et al. | |

FOREIGN PATENT DOCUMENTS

| | | |
|---|---|---|
| EP | 1630856 A1 | 3/2006 |
| EP | 2068326 A1 | 6/2009 |
| FR | 2 889 203 A1 | 2/2007 |
| WO | 9942901 A1 | 8/1999 |

OTHER PUBLICATIONS

D. L. Windt, "Stress, microstructure, and stability of Mo/Si, W/Si, and Mo/C multilayer films", J. Vac. Sci. Technol. A18(3), May/Jun. 2000, p.980.

J. M. Freitag et al., "Nonspecular x-ray reflectivity study of roughness scaling in Si/Mo multilayers", J. Appl. Phys., vol. 89, No. 2 (Jan. 15, 2001), p. 1101.

P. B. Mirkarimi "A Buffer-Layer Smoothing Strategy for the Mitigation of mo/Si Reticle Defects Nucleated by Small Substrate Particles", 2nd International Workshop on EUV Lithography, Oct. 18, 2000.

P. B. Mirkarimi et al., "Advances in the reduction and compensation of film-stress in high reflectance multilayer coatings for extreme ultraviolet lithography applications", preprint Feb. 20, 1998, 23rd Annual International Symposium on Microlithography, Santa Clara, California, Feb. 22-27, 1998.

R. Dietsch, et al., "Characterization of ultra smooth interfaces -in Mo/Si-multilayers" Fresenius J. Anal. Chem. (1995) 353: 383-388.

S. Bajt et al., "Investigation of the amorphous-to-crystalline transition in Mo/Si multilayers", J. Appl. Phys., vol. 90, No. 2 (Jul. 15, 2001), p. 1017.

S. Braun et al., "Mo/Si Multilayers with Different Barrier Layers for Applications as Extreme Ultraviolet Mirrors", Jpn. J. Appl. Phys. vol. 41 (2002) pp. 4047-4081.

Braun S. et al., "Mo/Si-multilayers for EUV applications prepared by Pulsed Laser Deposition (PLD)" Microelectronic Engineering, Elsevier Publishers, BV, Amsterdam, NL, vol. 57-58, Sep. 1, 2001, pp. 9-15.

* cited by examiner

REFLECTIVE OPTICAL ELEMENT AND METHOD FOR PRODUCTION OF SUCH AN OPTICAL ELEMENT

CROSS-REFERENCE TO RELATED PATENT APPLICATIONS

This is a Continuation of International Application PCT/EP2009/006112, with an international filing date of Aug. 22, 2009, which was published under PCT Article 21(2) in English, which claims priority under 35 U.S.C. §119(a) to German Patent Application No. 10 2008 042 212.6, filed on Sep. 19, 2008; the present application also claims the benefit under 35 U.S.C. §119(e)(1) of U.S. Provisional Application No. 61/098,568, filed on Sep. 19, 2008. The entire contents of the International Application and the priority applications are hereby incorporated into the present application by reference.

FIELD OF AND BACKGROUND OF THE INVENTION

The present invention relates to methods for producing a reflective optical element for an operating wavelength in the soft X-ray and extreme ultraviolet wavelength range, in particular for use in an EUV lithography apparatus, which has a multilayer system composed of at least two alternating materials having different real parts of the refractive index at the operating wavelength on a substrate, which exerts a stress on the substrate, and in which there is arranged between the multilayer system and the substrate a layer of material, wherein the thickness thereof is dimensioned in such a way that the stress of the multilayer system is compensated for, and also to methods for producing a reflective optical element for an operating wavelength in the soft X-ray and extreme ultraviolet wavelength range, in particular for use in an EUV lithography apparatus, which has a first multilayer system composed of at least two alternating materials having different real parts of the refractive index at the operating wavelength on a substrate, which exerts a layer stress on the substrate, and which has a second multilayer system composed of at least two alternating materials having different real parts of the refractive index at the operating wavelength on a substrate, which exerts an opposite layer stress on the substrate and is arranged between the first multilayer system and the substrate.

In addition, the invention relates to reflective optical elements produced by these methods. Furthermore, the invention relates to a projection system and an illumination system and also to an EUV lithography apparatus comprising at least one reflective optical element of this type.

In EUV lithography apparatuses, reflective optical elements for the extreme ultraviolet (EUV) or soft X-ray wavelength range (e.g. wavelengths of between approximately 5 nm and 20 nm) such as, for instance photomasks or multilayer mirrors are used for the lithography of semiconductor components. Since EUV lithography apparatuses generally have a plurality of reflective optical elements, the latter have to have a highest possible reflectivity in order to ensure a sufficiently high total reflectivity. Since a plurality of reflective optical elements are usually arranged one behind another in an EUV lithography apparatus, even relatively minor impairments of the reflectivity for each individual reflective optical element already affect the total reflectivity within the EUV lithography apparatus to a relatively large extent.

Reflective optical elements for the EUV and soft wavelength range generally have multilayer systems. These are alternately applied layers of a material having a higher real part of the refractive index at the operating wavelength (also called spacers) and of a material having a lower real part of the refractive index at the operating wavelength (also called absorbers), wherein an absorber-spacer pair forms a stack or a period. This in a certain way simulates a crystal whose network planes correspond to the absorber layers at which Bragg reflection takes place. The thicknesses of the individual layers and also of the repeating stacks can be constant over the entire multilayer system, or else vary, depending on which reflection profile is intended to be achieved.

Within multilayer systems, as early as during the coating process a stress can build up which acts on the underlying substrate and deform it to such a great extent that the optical imaging at the corresponding reflective optical element is critically disturbed. The type of stress depends, inter alia, on the materials used as spacers and absorbers and the thickness ratios present within a stack or a period. A measure of this thickness ratio is defined as $\Gamma$, the ratio of absorber layer thickness to total thickness of a period. The basic profile of the stress as a function of $\Gamma$ is illustrated schematically for a multilayer system on the basis of molybdenum as absorber material and silicon as spacer material in FIG. 5. For operating wavelengths in the range of approximately 12 nm to 14 nm, the highest reflectivities are obtained if reflective optical elements whose molybdenum-silicon multilayer systems have a $\Gamma$ in the region of approximately 0.4 are used. A compressive stress is to be expected there. A tensile stress is to be expected at higher values of $\Gamma$. The concrete relationship between the stress in the multilayer system and the $\Gamma$ value, that is to say in particular the gradient and the precise position of the zero crossing, in this case depends on the choice of the coating process and the respective coating parameters.

The relationship between stress and $\Gamma$ can be utilized to produce stress-reduced reflective optical elements. For this purpose, there is arranged between the substrate and the multilayer system optimized for a high reflectivity at the respective operating wavelength a further multilayer system, which is optimized in particular through the choice of an appropriate $\Gamma$ for the purpose of as far as possible compensating for the stress of the highly reflective multilayer system or minimizing the total stress within the reflective optical element. However, it should be taken into consideration that in the case of the coating processes suitable for the production of reflective optical elements for the soft X-ray and extreme ultraviolet wavelength range, namely magnetron sputtering, ion-beam-assisted sputtering and electron beam evaporation, with conventional coating parameters, starting from a certain thickness, a crystallization of the respective layer occurs particularly in the case of the absorber layer. In the case of molybdenum, for example, said crystallization already occurs starting from a layer thickness of approximately 2 nm. The crystallite sizes increase as the layer thickness increases, which leads to an increase in the microroughness and hence the surface roughness. At the high $\Gamma$ values necessary for the stress reduction, it is already possible to ascertain a roughening which in total, that is to say over the entire stress-reducing multilayer system, brings about an appreciable increase in the roughness at the surface of the stress-reducing multilayer system. Since this roughness also continues in the overlying highly reflective multilayer system, both the reflectivity and the optical imaging of the reflective optical element deteriorate. This deterioration is usually avoided by choosing the $\Gamma$ of the stress-reducing multilayer system to be small enough to avoid a roughening, and in return providing a larger number of periods of the stress-reducing multilayer system in order to sufficiently compensate for the stress. However, this entails the disadvantage of a coating process having an increased time duration and hence also a greater risk of failure as a result of incorrect coating.

OBJECTS OF THE INVENTION

It is an object of the present invention to provide reflective optical elements for operating wavelengths in the soft X-ray and extreme ultraviolet wavelength range and a method for producing them in which both a stress reduction and a high reflectivity are achieved.

SUMMARY OF THE INVENTION

In a first aspect of the invention, this object is achieved by a method for producing a reflective optical element for an operating wavelength in the soft X-ray and extreme ultraviolet wavelength range, in particular for use in an EUV lithography apparatus, which has a multilayer system composed of at least two alternating materials having different real parts of the refractive index at the operating wavelength on a substrate, which exerts a stress on the substrate, and in which there is arranged between the multilayer system and the substrate a layer of material, wherein the thickness thereof is dimensioned in such a way that the stress of the multilayer system is compensated for, wherein layer-forming particles having an energy of at least 40 eV are used for the deposition of the stress-compensating layer.

This object is also achieved by a method for producing a reflective optical element for an operating wavelength in the soft X-ray and extreme ultraviolet wavelength range, in particular for use in an EUV lithography apparatus, which has a first multilayer system composed of at least two alternating materials having different real parts of the refractive index at the operating wavelength on a substrate, which exerts a layer stress on the substrate, and which has a second multilayer system composed of at least two alternating materials having different real parts of the refractive index at the operating wavelength on a substrate, which exerts an opposite layer stress on the substrate and is arranged between the first multilayer system and the substrate, wherein layer-forming particles having an energy of at least 40 eV are used for the deposition of layers of the second multilayer system.

Particularly preferably, in the second multilayer system the layers of the material having a lower real part of the refractive index at the operating wavelength are deposited with the aid of layer-forming particles having an energy of at least 40 eV. In further preferred embodiments, all the layers of the second multilayer system are deposited with the aid of layer-forming particles having an energy of at least 40 eV.

Furthermore the said object is achieved by a method for producing a reflective optical element for an operating wavelength in the soft X-ray and extreme ultraviolet wavelength range, in particular for use in an EUV lithography apparatus, which has a first multilayer system composed of at least two alternating materials having different real parts of the refractive index at the operating wavelength on a substrate, which exerts a layer stress on the substrate, and which has a second multilayer system composed of at least two alternating materials having different real parts of the refractive index at the operating wavelength on a substrate, which exerts an opposite layer stress on the substrate and is arranged between the first multilayer system and the substrate, wherein an interlayer is deposited between the first multilayer system and the second multilayer system, wherein particles having an energy of at least 40 eV are used for depositing the interlayer or for smoothing the interlayer.

It has been found that through the coating by high-energy particles, a crystallization can be effectively prevented even in the case of relatively thick layers. Consequently, for the same thickness, it is possible to apply layers which have a lower surface roughness. In the case of stress-reducing multilayer systems, in particular, as a result higher Γ values can be chosen and significantly lower numbers of periods suffice to sufficiently compensate for the stress of an overlying highly reflective multilayer system without having to accept losses in the reflectivity and the optical imaging properties. It may already be sufficient to apply only one stress-compensating layer by high-energy layer-forming particles. As a result, the coating process can be shortened and the probability of failure on account of defective coatings can be reduced.

The deposition of interlayers with the aid of layer-forming particles having an energy of 40 eV or interlayers that are smoothed with the aid of an ion beam permits existing coating processes to be altered with little outlay in order to provide reflective optical elements which have both low stress and a high reflectivity. In this case, the interlayer can also both be deposited with higher-energy layer-forming particles and be subsequently polished by an ion beam. The smooth or smoothed interlayer has the function of compensating for inhomogeneities in the surface of the underlying stress-reducing multilayer system and of thereby reducing the surface roughness.

In a further aspect of the invention, said object is achieved by a reflective optical element produced according to one of the methods mentioned. In particular, this object is achieved by reflective optical elements whose stress-compensating layer or in whose second multilayer system the layers of the material having a lower real part of the refractive index at the operating wavelength, that is to say the absorber layers, are amorphous. Preferably, the stress-compensating layer, the interlayer or the layers of the material having a lower real part of the refractive index at the operating wavelength of the second multilayer system have a surface roughness of less than 0.2 nm, preferably less than 0.15 nm. The surface roughness here and hereinafter is the so-called rms roughness (root-mean-squared roughness) which corresponds to the mean of the square deviations of the actual surface points from a center line corresponding to the ideally planar course of the surface. In this case, the surface roughness refers to a lateral spatial wavelength range which here and hereinafter corresponds to an area in the range of 0.01 μm×0.01 to 1000 μm×1000 μm.

In addition, said object is achieved by a reflective optical element for an operating wavelength in the soft X-ray and extreme ultraviolet wavelength range, in particular for use in an EUV lithography apparatus, which has a multilayer system composed of at least two alternating materials having different real parts of the refractive index at the operating wavelength on a substrate, which exerts a layer stress on the substrate, wherein an amorphous layer of the material having a lower real part of the refractive index at the operating wavelength is arranged between the multilayer system and the substrate, wherein the layer thickness is dimensioned in such a way that the layer stress of the multilayer system is compensated for, wherein the layer has a surface roughness of less than 0.20 nm.

The object is furthermore achieved by a reflective optical element for an operating wavelength in the soft X-ray and extreme ultraviolet wavelength range, in particular for use in an EUV lithography apparatus, which has a first multilayer system composed of at least two alternating materials having different real parts of the refractive index at the operating wavelength on a substrate, which exerts a layer stress on the substrate, and which has a second multilayer system composed of at least two alternating materials having different real parts of the refractive index at the operating wavelength on a substrate, which exerts an opposite layer stress on the substrate and is arranged between the first multilayer system and the substrate, wherein an interlayer is arranged between the first multilayer system and the second multilayer system, said interlayer having a surface roughness of less than 0.20 nm.

Furthermore, this object is achieved by a reflective optical element for an operating wavelength in the soft X-ray and extreme ultraviolet wavelength range, in particular for use in an EUV lithography apparatus, which has a first multilayer system composed of at least two alternating materials having different real parts of the refractive index at the operating wavelength on a substrate, which exerts a layer stress on the substrate, and which has a second multilayer system composed of at least two alternating materials having different real parts of the refractive index at the operating wavelength on a substrate, which exerts an opposite layer stress on the substrate and is arranged between the first multilayer system and the substrate, wherein in the second multilayer system the layers of the material having a lower real part of the refractive index at the operating wavelength are amorphous; by such a reflective optical element wherein in the second multilayer system the layers of the material having a lower real part of the refractive index at the operating wavelength have a surface roughness of less than 0.20 nm; by such a reflective optical element wherein in the second multilayer system the ratio of the thickness of a layer of the material having a lower real part of the refractive index at the operating wavelength to the thickness of a period comprising a layer of the material having a lower real part and a layer of the material having a higher real part at the operating wavelength is greater than 0.75 and by such a reflective optical element wherein the number of periods comprising a layer of the material having a lower real part and a layer of the material having a higher real part at the operating wavelength in the second multilayer system is at most half as large as the number of periods in the first multilayer system.

In yet another aspect of the invention, said object is achieved by a projection system, in particular for an EUV lithography apparatus, comprising at least one of the reflective optical elements mentioned above, by an illumination system, in particular for an EUV lithography apparatus, comprising at least one of the reflective optical elements mentioned above, by a beam shaping system, in particular for an EUV lithography apparatus, comprising at least one of the reflective optical elements mentioned above, and also by an EUV lithography apparatus comprising at least one of the reflective optical elements mentioned above.

Advantageous configurations are found in the dependent claims.

BRIEF DESCRIPTION OF THE DRAWINGS

The present invention will be explained in greater detail with reference to a preferred exemplary embodiment. For this purpose.

DETAILED DESCRIPTION OF VARIOUS EMBODIMENTS

Figure 1:
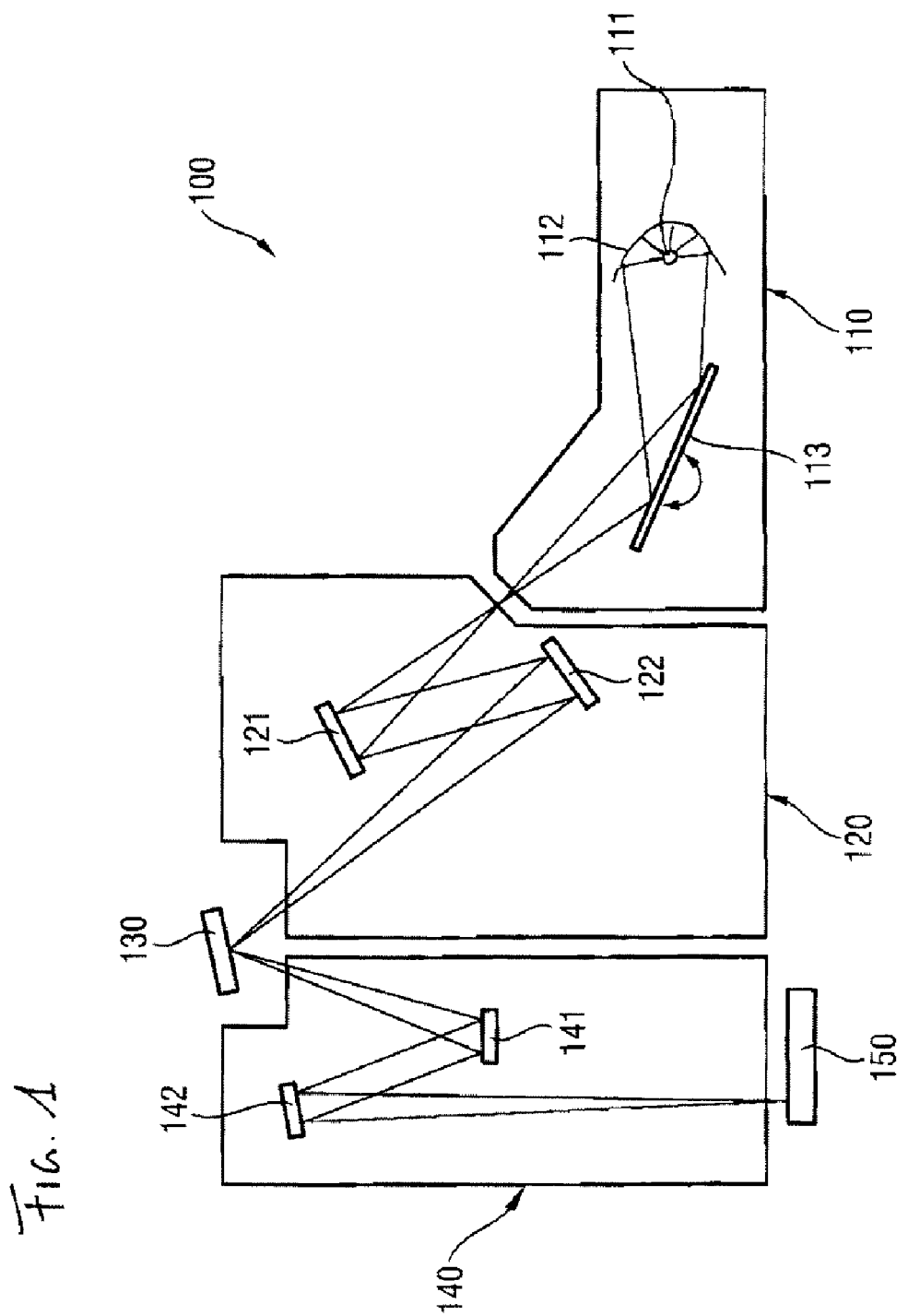
FIG. 1 schematically shows an embodiment of an EUV lithography apparatus.

FIG. 1 schematically illustrates an EUV lithography apparatus 100. Essential components are the beam shaping system 110, the illumination system 120, the photomask 130 and the projection system 140.

By way of example, a plasma source or else a synchrotron can serve as radiation source 111 for the beam shaping system 110. For the wavelength range of 5 nm to 12 nm, in particular, X-ray lasers (X-FEL) are also appropriate as radiation source. The emerging radiation is firstly concentrated in a collector mirror 112. In addition, the desired operating wavelength is filtered out with the aid of a monochromator 113 by varying the angle of incidence. In the wavelength range mentioned the collector mirror 112 and the monochromator 113 are usually embodied as reflective optical elements which, in order to achieve a reflection of the radiation of the operating wavelength, have a multilayer system composed of at least two alternating materials having different real parts of the refractive index at the operating wavelength. Collector mirrors are often reflective optical elements embodied in shell-shaped fashion in order to achieve a focusing or collimating effect. In this case, both the collector mirror 112 and the monochromator 113 can be configured as stress-reduced reflective optical elements, as will be explained in detail later. Depending on the choice of the radiation source and the configuration of the collector mirror, a monochromator can also be dispensed with.

The operating beam conditioned with regard to wavelength and spatial distribution in the beam shaping system 110 is then introduced into the illumination system 120. In the example illustrated in FIG. 1, the illumination system 120 has two mirrors 121, 122, which are configured as stress-reduced reflective optical elements in the present example. The mirrors 121, 122 direct the beam onto the photomask 130, which has the structure that is intended to be imaged onto the wafer 150. The photomask 130 is likewise a reflective optical element for the EUV and soft wavelength range, said element being exchanged depending on the production process. With the aid of the projection system 140, the beam reflected from the photomask 130 is projected onto the wafer 150 and the structure of the photomask is thereby imaged onto said wafer. In the example illustrated, the projection system 140 has two mirrors 141, 142, which are likewise configured as stress-reduced reflective optical elements in the present example. It should be pointed out that both the projection system 140 and the illumination system 120 can likewise each have just one or else three, four, five or more mirrors.

In the example illustrated in FIG. 1, all the mirrors 121, 122, 141, 142 are configured as stress-reduced reflective optical elements, as will be explained in detail later. Optionally, the photomask 130 can also be a stress-reduced reflective optical element of this type. It should be pointed out that it is also possible for just one or some reflective optical elements to be embodied as stress-reduced reflective optical element. Stress-reduced reflective elements are preferably arranged in the illumination system 120 and particularly preferably in the projection system 140, since good optical imaging properties are particularly important there.

FIGS. 2a-d show, by way of example and only schematically, different stress-reduced reflective optical elements 1 for the extreme ultraviolet and soft X-ray wavelength range, in particular for use in EUV lithography apparatuses, e.g. as mirror of the projection or illumination system or else as photomask, collector mirror or monochromator. In all the examples illustrated here, the reflective optical elements 1 have a multilayer system 4 and substrate 2.

The multilayer system 4 essentially comprises multiply repeating stacks or periods 40. The essential layers 41, 42 of a period, which lead to sufficiently high reflection at an operating wavelength in particular as a result of the multiple repetition of the periods 40, are the so-called absorber layers 41 composed of material having a lower real part of the refractive index and the so-called spacer layers 42 composed of a material having a higher real part of the refractive index. This to a certain extent simulates a crystal, wherein the absorber layers 41 correspond to the network planes within the crystal which are at a distance from one another that is defined by the respective spacer layers 42 and at which reflection of incident EUV or soft X-ray radiation takes place. The thicknesses of the layers are chosen such that at a specific operating wavelength the radiation reflected at each absorber layer 41 is superimposed constructively in order thus to achieve a high reflectivity of the reflective optical element. It should be pointed out that the thicknesses of the individual layers 41, 42 and also of the repeating stacks 20 can be constant over the entire multilayer system, or else vary, depending on which reflection profile is intended to be achieved. In particular, it is possible to optimize multilayer systems for specific wavelengths in the case of which the maximum reflectivity and/or the reflected bandwidth is greater than in the case of non-optimized multilayer systems. In the case of radiation having this wavelength, the corresponding reflective optical element 1 is used e.g. during EUV lithography, for which reason this wavelength for which the reflective optical element 1 has been optimized is also called the operating wavelength.

Moreover, a protective layer 3 has additionally been applied to the multilayer system 4 for protection against external influences such as contamination, which protective layer can be constructed from a plurality of different material layers. Furthermore, it is also possible to provide interlayers (not illustrated here) which, as diffusion barriers between the absorber layers and spacer layers, increase the thermodynamic and thermal stability of the multilayer system 4.

If the absorber material of the multilayer system 4 is molybdenum and the spacer material is silicon, for example a number of periods of 40 to 50 is preferably employed, in the case of a period thickness of approximately 6.7 nm to 7.5 nm and a Γ value in the range of 3.5 to 4.5, in order to obtain multilayer systems which have a maximum reflectivity at an operating wavelength in the range of 12.5 nm to 14 nm.

Figure 2A:
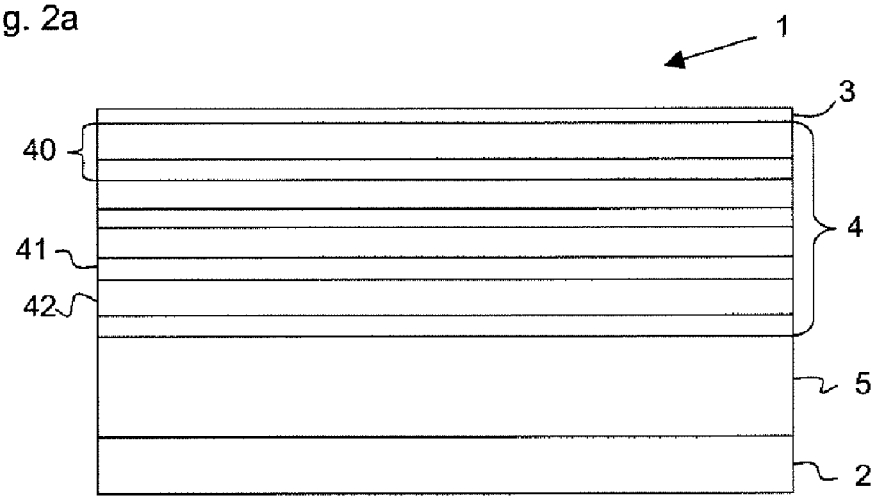
FIGS. 2a-d schematically show the construction of different embodiments of a reflective optical element.

In the example illustrated in FIG. 2a, a layer 5 is arranged for compensation of the stress within the multilayer system 4 which acts on the substrate 5 and can deform the latter. This layer 5 can be deposited by layer-forming particles having an energy of 40 eV or more, preferably 90 eV or more. What is achieved in this way is that even in the case of relatively large layer thicknesses that may be necessary for the stress compensation, the crystallization of this layer is suppressed and the layer 5 is substantially amorphous. It is possible to achieve surface roughnesses of this layer of less than 0.20 nm, preferably less than 0.15 nm. The absorber material of the multilayer system 4 is particularly preferably used as material. As a result, a Γ value of 1 is achieved, and consequently, a particularly good stress compensation per layer thickness.

In the case of multilayer systems 4 on the basis of molybdenum and silicon, for example, the stress-reducing layer 5 is particularly preferably composed of molybdenum.

In the case of multilayer systems 4 applied with particularly low stress, the single stress-reducing layer 5 can suffice for the stress compensation. This is the case particularly for molybdenum-silicon multilayer systems if they have been applied by for example electron beam evaporation. In order to compensate for typical compressive stresses of approximately −130 MPa to −180 MPa without interlayers or −220 MPa to −300 MPa with interlayers thicknesses of the layer 5 in the range of approximately 100 nm to 250 nm would suffice. By way of example, a compressive stress of approximately −180 MPa could be compensated for by a layer 5 having a thickness of approximately 150 nm. The layer 5 is preferably applied by the pulsed laser coating (also PLD (pulsed laser deposition) method), which usually provides a significant proportion of layer-forming particles around approximately 100 eV, as will be explained in greater detail below.

Figure 2B:
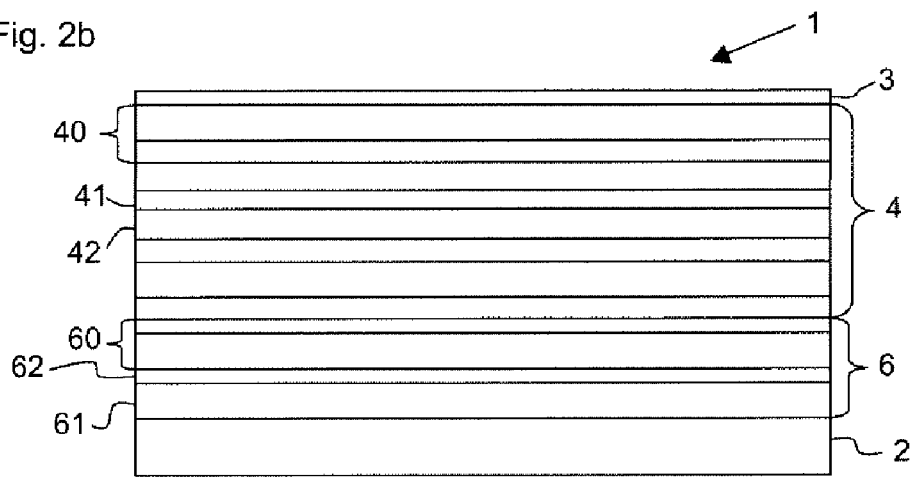

In the example illustrated in FIG. 2b, a multilayer system 6 in arranged for stress reduction within the reflective optical element 1 between the highly reflective multilayer system 4 and the substrate 2. Like the multilayer system 4 as well, it is constructed from repeating periods 60 having a layer 61 composed of absorber material and layer 62 composed of spacer material. In order to simplify the overall coating process, the same materials as for the highly reflective multilayer system 4 are preferably used for the stress-reducing multilayer system 6.

The absorber layers 61 of the multilayer system 6 are amorphous. The multilayer system 6 has high Γ values, preferably of greater than 0.75, particularly preferably of greater than 0.8. As a result, a good stress compensation is made possible even in the case of high stresses of the multilayer system 4. In particular, the absorber layer thicknesses can be over 3 nm or more. The surface roughness is less than 0.20 nm, preferably less than 0.15 nm. Consequently, the reflectivity and/or the optical imaging properties of the multilayer system 4 of the reflective optical element 1 are not influenced to such an adverse extent that the reflective optical element 1 could not be used in the context of EUV lithography. The number of periods 60 within the multilayer system 6 is significantly lower than in the case of conventional stress-reduced reflective optical elements. While approximately just as many periods compared with the highly reflective multilayer system are conventionally necessary for the stress-reducing multilayer system in order to compensate for the stress of said highly reflective multilayer system, the stress-reduced optical elements described here have significantly fewer periods in the stress-reducing multilayer system than in the highly reflective multilayer system. They advantageously have at most half as many periods in the stress-reducing multilayer system as in the highly reflective multilayer system.

By way of example, it is possible to produce a stress-reduced reflective optical element 1 for EUV lithography as illustrated in FIG. 2b and on the basis of molybdenum and silicon by firstly applying 17 periods 60 having a period thickness of 9.0 nm and having a Γ value of 0.8 to a substrate 2 by a PLD method. In this case, the laser parameters are set such that average kinetic energies of the ions generated in the plasma of around 100 eV are obtained. 7.2 nm thick amorphous absorber layers 61 composed of molybdenum having a low surface roughness of less than 0.15 nm are formed as a result. Optionally, the individual layers 61, 62 can each be additionally smoothed by an ion beam after their application. The post-processing using an ion beam additionally has the advantage that the respective layer is densified, such that when the reflective optical element is put into operation, in the course of which it can be subjected to a considerable thermal load as a result of the soft X-ray or EUV radiation, subsequent compaction of the multilayer system 6, which could alter the optical properties of the reflective optical element, does not take place. Once 17 periods 60 of the stress-reducing multilayer system 6 have been applied, the coating is continued by electron beam evaporation in a conventional manner in order to deposit 50 periods 40 likewise composed of molybdenum as absorber layer 41 and silicon as spacer layer 42. In this case, the thickness of a period 40 is 7.0 nm given a Γ of 0.4. If the coating processes are carried out by a PLD method and by electron beam evaporation in different chambers, the reflective optical element 1 is preferably brought from one chamber into the other chamber via a lock. By this, contamination or damage of the reflective optical element 1 during the change of chamber can be avoided and the time expended for the change of chamber can be kept particularly short. The reflective optical element 1 described in this example has a total stress over both multilayer systems 4, 6 of approximately 3.6 MPa. This should be compared with a stress of −180 MPa that the highly reflective multilayer system 4 has. The stress of the reflective optical element 1 described in this example is negligibly small by comparison therewith.

Owing to the small number of periods 60, this exemplary stress-reduced reflective optical element 1 is produced in shorter coating times than conventional reflective optical elements. The failure rate during production on account of coating deviations therefore also decreases. By virtue of the fact that the layers of the stress-compensating multilayer system are amorphous on account of the high energy of the layer-forming particles, the surface roughness thereof is so low that the reflectivity of the highly reflective multilayer system is not adversely influenced.

Figure 2C:
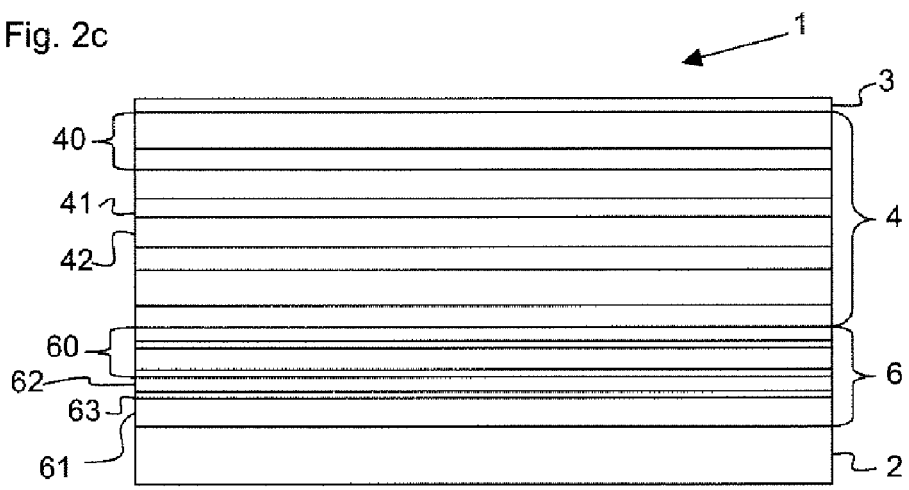

The example illustrated in FIG. 2c differs from the example illustrated in FIG. 2b in that an additional interlayer 63 is arranged between at least one absorber layers 61 and one spacer layers 62 of the stress-reducing multilayer system 6. In the example illustrated here, interlayers 62 are arranged between all the absorber and spacer layers 61, 62 of the multilayer system 6. In further embodiments, they can also be arranged only at the interfaces from absorber to spacer layer or from spacer to absorber layer. The interlayers limit the compaction of the periods 60 when the reflective optical element 1 is put into operation and irradiated with soft X-ray or EUV radiation. They can, as diffusion barrier, also prevent the layers 61, 62 from being intermixed to an excessively great extent. Overall, the interlayers 63 permit better control of the real layer thicknesses within the multilayer system 6. The interlayers 63 can be applied in a respectively dedicated coating step. With the use of an ion beam with suitable ions, interlayers can also be introduced simultaneously during a post-processing an absorber or spacer layer, e.g. during a polishing process.

Figure 2D:
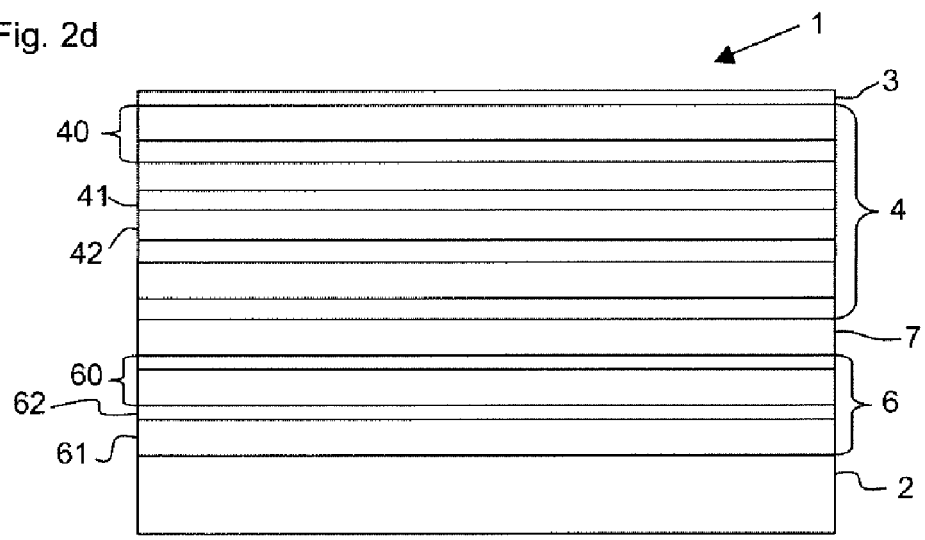

The example illustrated in FIG. 2d differs from the example illustrated in FIG. 2b in that an interlayer 7 is arranged between the highly reflective multilayer system 4 and the stress-compensating multilayer system 6 as was described for example with reference to FIG. 2b or FIG. 2c. Said interlayer 7 serves to compensate for possible surface roughnesses of the underlying stress-compensating multilayer system 6 and preferably has a surface roughness of less than 0.20 nm, particularly preferably of less than 0.15 nm. For this purpose it is preferably applied as an amorphous and smooth layer by layer-forming particles having an energy of 40 eV and more. In particular, the layer can be post-processed with the aid of an ion beam, for example, in order to additionally smooth it. As a result, it is also possible to produce smooth interlayers that have been applied using layer-forming particles having an energy of less than 40 eV. A particular advantage of the interlayer 7 is that a figure required for the optical imaging properties of the reflective optical element 1 can be incorporated into the interlayer 7 by post-processing by an ion beam, for example, or a figure that has been preformed in the substrate and impaired by the stress-reducing multilayer system 6 can be reworked. A material of one of the other layers is preferably used as material for the interlayer 7, in order to simplify the coating process. Particularly in the case of highly reflective multilayer systems 4 on the basis of silicon as spacers and molybdenum as absorbers, silicon is preferably used for the interlayer 7. The interlayer 7 advantageously has a thickness in the range of 3 nm to 20 nm. This ensures that the interlayer 7 does not introduce excessively high stresses into the reflective optical element 1.

It should be pointed out that the interlayer 7 is in particular also suitable for being provided in conventional stress-reduced reflective optical elements, in order to compensate for the surface roughness of the conventional stress-compensating multilayer systems. An improvement in the reflectivity and in the optical imaging properties can thus be improved by only minor modification of existing coating processes.

Some examples for producing stress-reduced reflective optical elements is explained in conjunction with FIGS. 3a-d, which show schematic flow charts concerning different exemplary embodiments of the production methods.

Figure 3A:
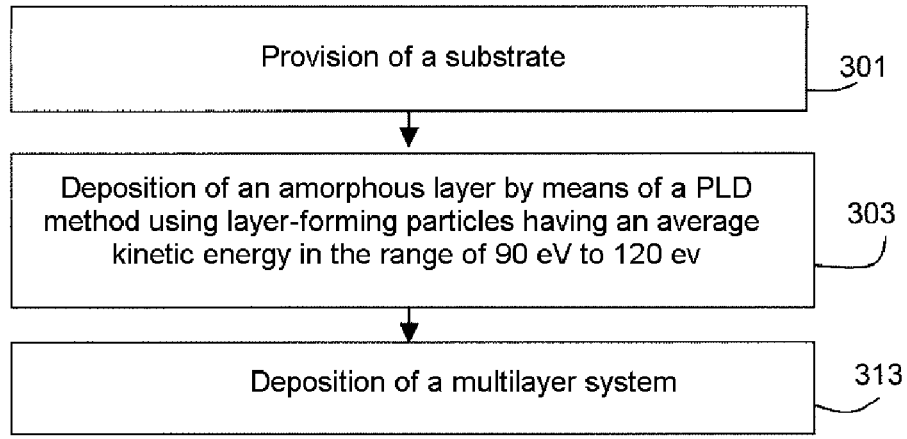
FIGS. 3a-d show flow charts concerning different embodiments of the method for producing reflective optical elements.

In the example illustrated in FIG. 3a, firstly a substrate is provided (step 301), onto which an amorphous layer is deposited in the PLD method. During the PLD method, a material target is irradiated by a laser in pulses. In this case, the laser should have an intensity and wavelength such that the during a laser pulse at the target surface material is heated to form a plasma and expands into the vacuum. The resulting particle flow comprises slow fragments or droplets of the target material and also fast ions and atoms. The laser can be set for the respective target material such that the ions has an energy distribution having an average kinetic energy in the range of approximately 90 to 120 eV. Said ions impinge on the substrate and deposit an amorphous layer there (step 303). A multilayer system is thereupon deposited on the amorphous layer by conventional methods for the preparation of reflective optical elements for EUV lithography, such as, for instance, magnetron sputtering, ion assisted sputtering or electron beam evaporation, said multilayer system being optimized for a high reflectivity at a desired operating wavelength in the soft X-ray or EUV wavelength range. Although the PLD method is a technology that is generally known in the case of coatings, it is used only rarely in the production of multilayer systems of reflective optical elements for operating wavelengths in the soft X-ray or EUV wavelength range, since the multilayer systems thereby produced have a poor reflectivity compared with the coating methods just mentioned.

Figure 3B:
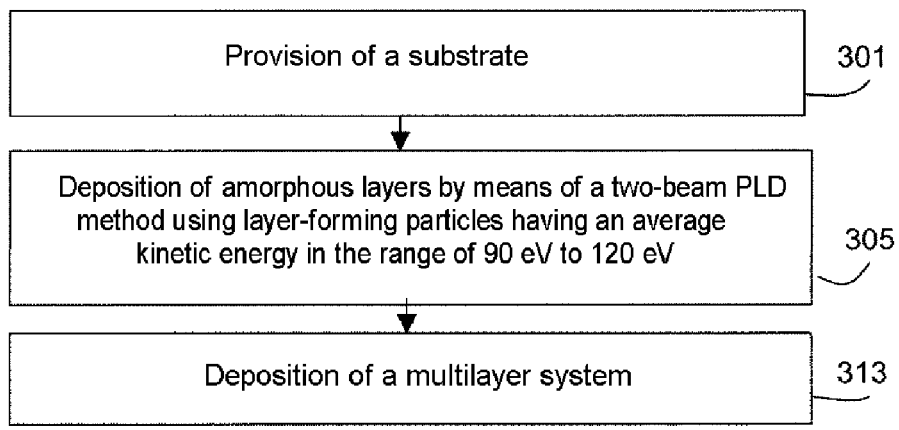
Figure 4:
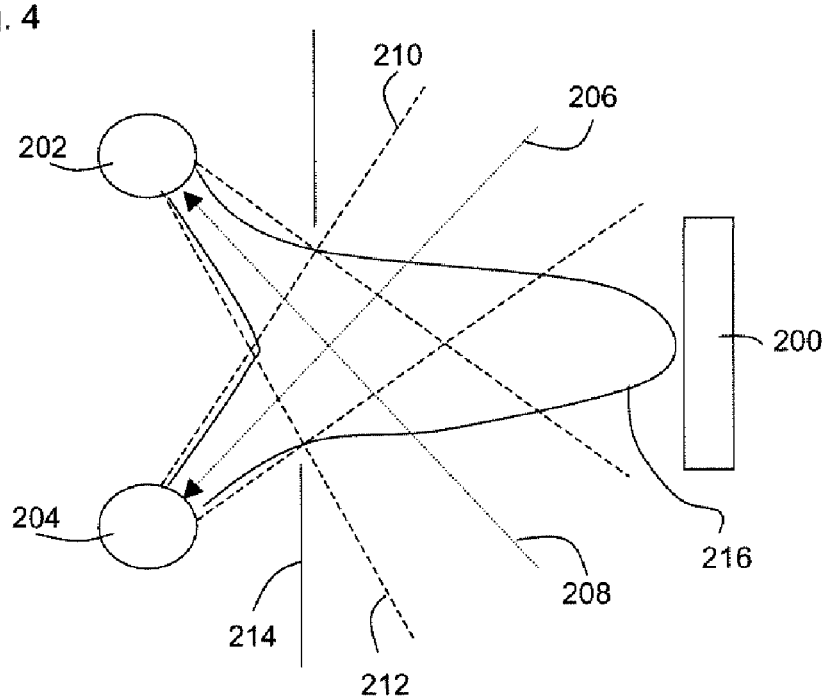
FIG. 4 schematically shows the coating geometry when using two lasers in the case of the pulsed laser coating.
Figure 5:
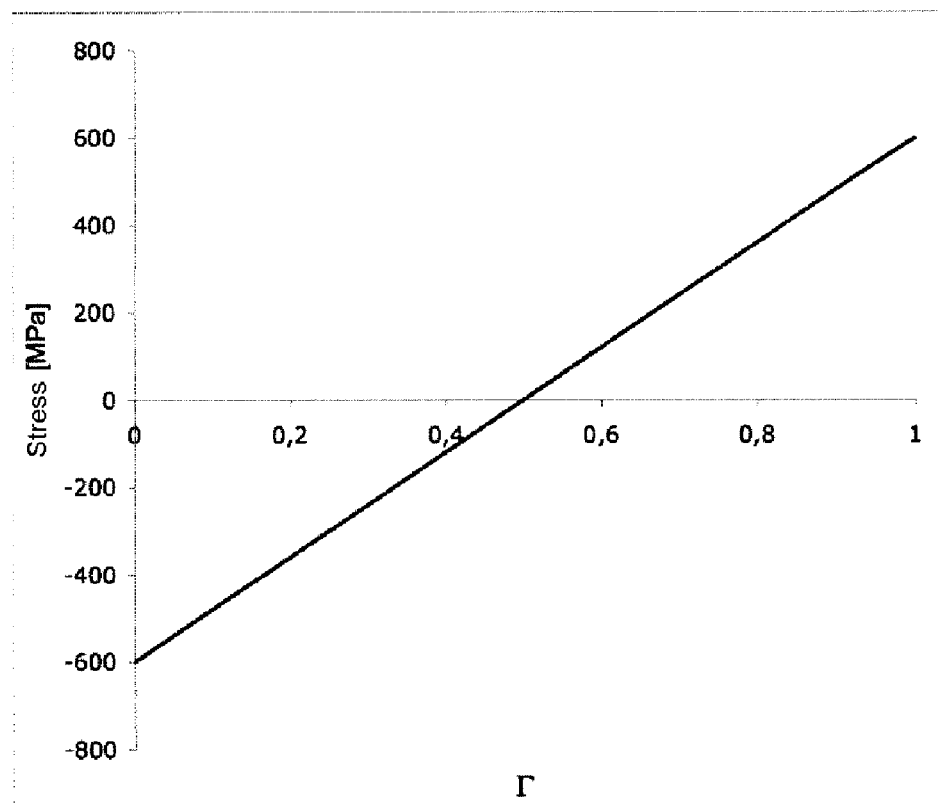
FIG. 5 schematically shows the relationship between the layer thickness ratio Γ in a multilayer system and the stress in this multilayer system.

In the example illustrated in FIG. 3b, a stress-reducing multilayer system is deposited on the substrate by PLD coating (step 305). In contrast to the example from FIG. 3a, however, two lasers are used, which are arranged in such that their plasma lobes cross one another. The coating geometry for this embodiment is illustrated schematically in FIG. 4. Two material targets 202, 204 are irradiated by pulsed lasers 206, 208. As a result of the local heating of the target material at points, a plasma forms and target material expands into the vacuum. The distribution of the material droplets is indicated by the dashed lines 210 and 212, respectively. The lasers 208, 210 are arranged such that their plasma flames which in proximity to the targets have a distribution comparable to the droplets cross one another and combine to form one plasma flame 216. This effect is intensified by the diaphragm 214. The droplets also continue to propagate in a straight line after passing through the diaphragm 214. The substrate 200 to be coated is then arranged such that it is struck only by the ions from the plasma flame 216 but not by the droplets, which could possibly lead to crystalline regions and other inhomogeneities in the coating. After the deposition of the amorphous layers of a stress-reducing multilayer system, the layers of a highly reflective multilayer system are deposited in a conventional manner (step 313).

Figure 3C:
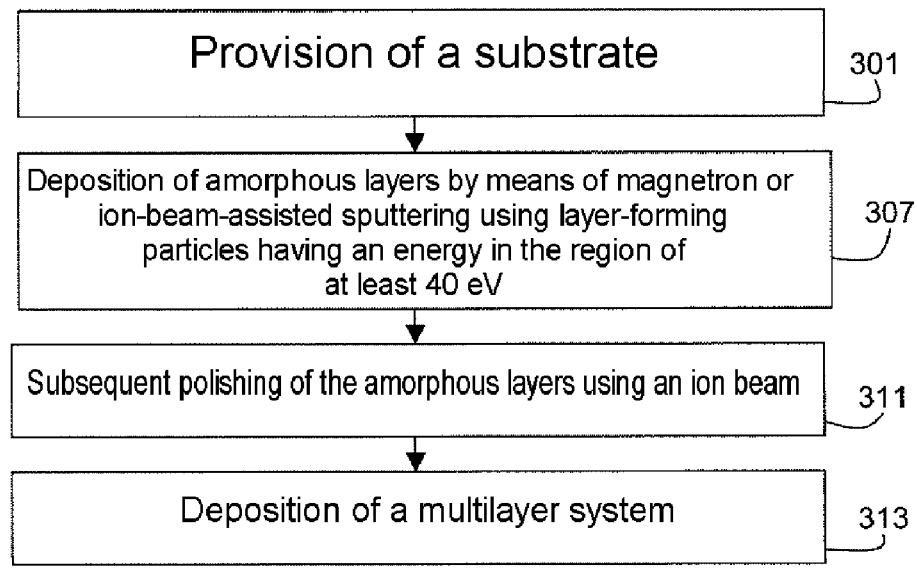

In accordance with the example illustrated in FIG. 3c amorphous layers of a stress-reduced multilayer system are applied on the provided substrate (step 301) by magnetron sputtering or ion-beam-assisted sputtering, wherein the coating parameters are set such that the layer-forming particles have an average kinetic energy of at least 40 eV in order to form amorphous layers having low surface roughness (step 307). The energy of the layer-forming particles can also be 90 eV or higher. In the example illustrated here, at least one layer, after the deposition there of, is additionally subsequently polished using an ion beam (step 309). Preferably, at least the topmost layer is subsequently polished, on which the highly reflective multilayer system is subsequently deposited (step 311). It is also possible for all the layers or else the amorphous layer from the example illustrated in FIG. 3a to be post-processed by an ion beam.

Figure 3D:
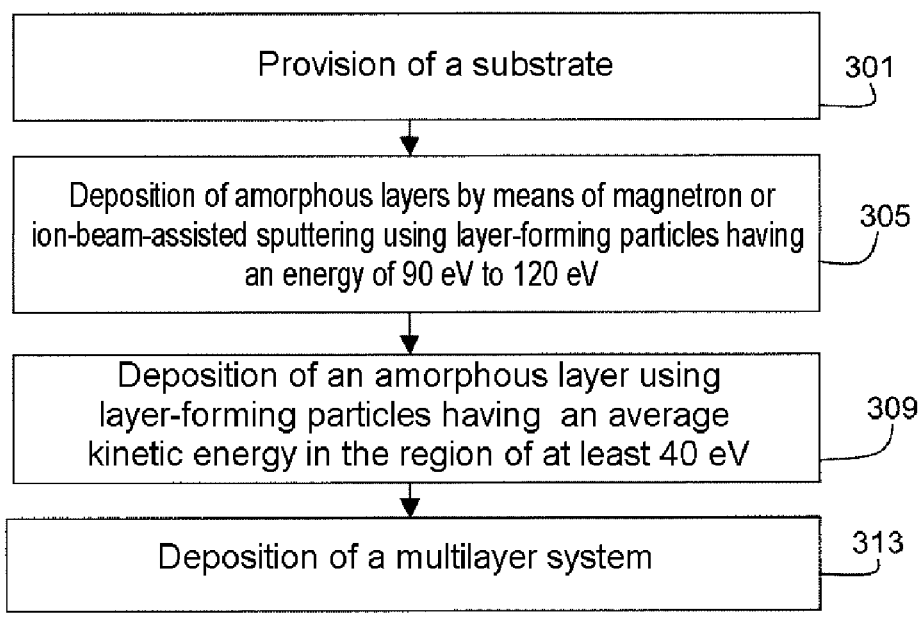

The example illustrated in FIG. 3d differs from the example illustrated in FIG. 3b to the effect that an amorphous layer is deposited between the stress-reducing multilayer system and the highly reflective multilayer system by PLD, magnetron sputtering or ion-beam-assisted sputtering using layer-forming particles having an average kinetic energy in the region of at least 40 eV or higher (step 309). In further variants, the interlayer can additionally be post-processed for the purpose of subsequent smoothing or processing of the figure using an ion beam, for example. If the interlayer is subsequently smoothed, it can also be deposited using layer-forming particles having an energy of less than 40 eV. In one preferred variant, the layers of the stress-reducing multilayer system below the interlayer are deposited in a conventional manner, in which case they can also be crystalline.

It should be pointed out that the individual method steps can also be modified and combined with one another in a wide variety of ways by the person skilled in the art in order to produce a stress-reduced reflective optical element which is optimally adapted to the respective requirements.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for producing a reflective optical element for an operating wavelength in the soft X-ray and extreme ultraviolet wavelength range, comprising:
   arranging a multilayer system composed of at least two alternating materials having different real parts of the refractive index at the operating wavelength on a substrate, the multilayer system exerting a stress on the substrate,
   arranging, between the multilayer system and the substrate, a layer of material, dimensioning a thickness of the layer such that the stress of the multilayer system is at least partly compensated, and
   depositing the stress-compensating layer using layer-forming particles that have an energy of at least 40 eV.

2. A method for producing a reflective optical element for an operating wavelength in the soft X-ray and extreme ultraviolet wavelength range, comprising:
   arranging a first multilayer system composed of at least two alternating materials having different real parts of the refractive index at the operating wavelength on a substrate, the first multilayer system exerting a layer stress on the substrate,
   arranging a second multilayer system composed of at least two alternating materials having different real parts of the refractive index at the operating wavelength on a substrate, the second multilayer system exerting an opposite layer stress on the substrate, between the first multilayer system and the substrate, and
   depositing the second multilayer system using layer-forming particles that have an energy of at least 40 eV.

3. A method for producing a reflective optical element for an operating wavelength in the soft X-ray and extreme ultraviolet wavelength range, comprising:
   arranging a first multilayer system composed of at least two alternating materials having different real parts of the refractive index at the operating wavelength on a substrate, the first multilayer system exerting a layer stress on the substrate,
   arranging a second multilayer system composed of at least two alternating materials having different real parts of the refractive index at the operating wavelength on a substrate, the second multilayer system exerting an opposite layer stress on the substrate, between the first multilayer system and the substrate, and
   depositing an interlayer between the first multilayer system and the second multilayer system, wherein particles having an energy of at least 40 eV are used for at least one of: depositing the interlayer, and smoothing the interlayer.

4. The method according to claim 1, wherein the layer-forming particles have an energy of at least 90 eV.

5. The method according to claim 1, wherein the stress-compensating layer is deposited by magnetron sputtering or ion-beam-assisted sputtering.

6. The method according to claim 1, wherein the stress-compensating layer is deposited by pulsed laser coating.

7. The method according to claim 6, wherein the pulsed laser coating comprises using two lasers, which are arranged such that their plasma lobes cross one another.

8. The method according to claim 1, further comprising post-processing the stress-compensating layer using an ion beam after the layer has been applied.

9. A reflective optical element, produced according to the method according to claim 1.

10. The reflective optical element according to claim 9, wherein the layer between multilayer system and substrate is amorphous.

11. The reflective optical element according to claim 9, wherein the layer between multilayer system and substrate has a surface roughness of less than 0.20 nm.

12. The reflective optical element according to claim 9, wherein the layer is composed of amorphous molybdenum.

13. A reflective optical element produced according to the method claimed in claim 3.

14. The reflective optical element according to claim 13, wherein the interlayer is composed of silicon.

15. The reflective optical element according to claim 13, wherein the interlayer has a thickness in the range of 3 nm to 20 nm.

16. The reflective optical element according to claim 13, wherein the interlayer has a surface roughness of less 0.20 nm.

17. A reflective optical element, produced according to the method as claimed in claim 2.

18. The reflective optical element according to claim 17, wherein, in the second multilayer system, the layers of the material having a lower real part of the refractive index at the operating wavelength are amorphous.

19. The reflective optical element according to claim 17, wherein, in the second multilayer system, the layers of the material having a lower real part of the refractive index at the operating wavelength are composed of amorphous molybdenum.

20. The reflective optical element according to claim 17, wherein, in the second multilayer system, the layers of the material having a lower real part of the refractive index at the operating wavelength have a surface roughness of less than 0.20 nm.

21. The reflective optical element according to claim 17, wherein, in the second multilayer system the ratio (Γ) of the thickness of a layer of the material having a lower real part of the refractive index at the operating wavelength to the thickness of a period comprising a layer of the material having a lower real part and a layer of the material having a higher real part at the operating wavelength is greater than 0.75.

22. The reflective optical element according to claim 17, wherein, in the second multilayer system, the thickness of a layer of the material having a lower real part is greater than 3 nm.

23. The reflective optical element according to claim 17, wherein the number of periods of the material having a lower real part and a layer of the material having a higher real part at the operating wavelength in the second multilayer system is at most half as large as the number of periods in the first multilayer system.

24. The reflective optical element according to claim 17, wherein an interlayer is arranged in the second multilayer system at least one interface between the layers composed of material having a higher refractive index at the operating wavelength and the layers composed of material having a lower refractive index.

25. The reflective optical element according to claim 9, comprising molybdenum as material having the lower refractive index at the operating wavelength and silicon as material having the higher refractive index.

26. A reflective optical element configured for an operating wavelength in at least one of the soft X-ray and extreme ultraviolet wavelength range, comprising:
a substrate;
a multilayer system composed of at least two alternating materials having different real parts of the refractive index at the operating wavelength on the substrate, which exerts a stress on the substrate; and
an amorphous layer of the material having a lower real part of the refractive index at the operating wavelength arranged between the multilayer system and the substrate, wherein a thickness of the layer is dimensioned to compensate for the stress of the multilayer system, and wherein the layer has a surface roughness of less than 0.20 nm.

27. A reflective optical element configured for an operating wavelength in at least one of the soft X-ray and extreme ultraviolet wavelength range, comprising:
a substrate;
a first multilayer system composed of at least two alternating materials having different real parts of the refractive index at the operating wavelength on the substrate, which exerts a layer stress on the substrate;
a second multilayer system composed of at least two alternating materials having different real parts of the refractive index at the operating wavelength on the substrate, which exerts an opposite layer stress on the substrate and is arranged between the first multilayer system and the substrate; and
an interlayer arranged between the first multilayer system and the second multilayer system; wherein the interlayer has a surface roughness of less than 0.20 nm.

28. The reflective optical element according to claim 27, wherein the interlayer is composed of silicon.

29. The reflective optical element according to claim 27, wherein the interlayer has a thickness in the range of 3 nm to 20 nm.

30. A reflective optical element configured for an operating wavelength in at least one of the soft X-ray and extreme ultraviolet wavelength range, comprising:
a substrate;
a first multilayer system composed of at least two alternating materials having different real parts of the refractive index at the operating wavelength on the substrate, which exerts a layer stress on the substrate, and
a second multilayer system composed of at least two alternating materials having different real parts of the refractive index at the operating wavelength on the substrate, which exerts an opposite layer stress on the substrate and is arranged between the first multilayer system and the substrate, wherein, in the second multilayer system the layers of the material having a lower real part of the refractive index at the operating wavelength are amorphous.

31. The reflective optical element according claim 30, wherein, in the second multilayer system, the layers of the material having a lower real part of the refractive index at the operating wavelength are composed of amorphous molybdenum.

32. A reflective optical element configured for an operating wavelength in at least one of the soft X-ray and extreme ultraviolet wavelength range, comprising:
a substrate;
a first multilayer system composed of at least two alternating materials having different real parts of the refractive index at the operating wavelength on the substrate, which exerts a layer stress on the substrate, and
a second multilayer system composed of at least two alternating materials having different real parts of the refractive index at the operating wavelength on the substrate, which exerts an opposite layer stress on the substrate and is arranged between the first multilayer system and the substrate, wherein, in the second multilayer system the layers of the material having a lower real part of the refractive index at the operating wavelength have a surface roughness of less than 0.20 nm.

33. A reflective optical element configured for an operating wavelength in at least one of the soft X-ray and extreme ultraviolet wavelength range, comprising:
a substrate;
a first multilayer system composed of at least two alternating materials having different real parts of the refractive index at the operating wavelength on the substrate, which exerts a layer stress on the substrate, and a second multilayer system composed of at least two alternating materials having different real parts of the refractive index at the operating wavelength on the substrate, which exerts an opposite layer stress on the substrate and is arranged between the first multilayer system and the substrate, wherein in the second multilayer system the ratio ($\Gamma$) of the thickness of a layer of the material having a lower real part of the refractive index at the operating wavelength to the thickness of a period comprising a layer of the material having a lower real part and a layer of the material having a higher real part at the operating wavelength is greater than 0.75.

34. Reflective optical element according to claim 33, wherein, in the second multilayer system, the thickness of a layer of the material having a lower real part is greater than 3 nm.

35. A reflective optical element configured for an operating wavelength in at least one of the soft X-ray and extreme ultraviolet wavelength range, comprising:
 a substrate;
 a first multilayer system composed of at least two alternating materials having different real parts of the refractive index at the operating wavelength on the substrate, which exerts a layer stress on the substrate, and
 a second multilayer system composed of at least two alternating materials having different real parts of the refractive index at the operating wavelength on the substrate, which exerts an opposite layer stress on the substrate and is arranged between the first multilayer system and the substrate, wherein the number of periods comprising a layer of the material having a lower real part and a layer of the material having a higher real part at the operating wavelength in the second multilayer system is at most half as large as the number of periods in the first multilayer system.

36. The reflective optical element according to claim 32, further comprising an interlayer arranged between the first multilayer system and the second multilayer system.

37. The reflective optical element according to claim 36, wherein the interlayer is amorphous.

38. The reflective optical element according to claim 36, wherein the interlayer has a surface roughness of less than 0.20 nm.

39. The reflective optical element according to claim 36, wherein the interlayer is composed of silicon.

40. The reflective optical element according to claim 36, wherein the interlayer has a thickness in the range of 3 nm to 20 nm.

41. The reflective optical element according to claim 30, wherein an interlayer is arranged in the second multilayer system at least one interface between the layers composed of material having a higher refractive index at the operating wavelength and the layers composed of material having a lower refractive index.

42. The reflective optical element according to claim 27, comprising molybdenum as material having the lower refractive index at the operating wavelength and silicon as material having the higher refractive index.

43. A projection system, comprising at least one reflective optical element as claimed in claim 26.

44. An illumination system, comprising at least one reflective optical element as claimed in claim 26.

45. A lithography apparatus configured for extreme ultraviolet light and comprising at least one reflective optical element as claimed in claim 26.

* * * * *

UNITED STATES PATENT AND TRADEMARK OFFICE
CERTIFICATE OF CORRECTION

PATENT NO. : 8,246,182 B2
APPLICATION NO. : 13/051782
DATED : August 21, 2012
INVENTOR(S) : Gisela von Blanckenhagen It is certified that error appears in the above-identified patent and that said Letters Patent is hereby corrected as shown below:

Title Page 1, column 1: delete "Gisela Von Blanckenhagen" and insert -- Gisela von Blanckenhagen --

Title Page 1, column 2, under Foreign Patent Documents: delete "3/2011" and insert -- 3/2004 --

Title Page 2, column 2, line 9: delete "high reflectance" and insert -- high-reflectance --

Title Page 2, column 2, line 23: delete "BV," and insert -- BV., --

In the Specifications:

Column 1, line 65: delete "soft wave-" and insert -- soft X-ray wave- --

Column 4, line 45: delete "0.01 μm × 0.01 to" and insert -- 0.01 μm × 0.01 μm to --

Column 6, line 64: delete "reflective elements" and insert -- reflective optical elements --

Column 8, line 11: delete "interlayers" and insert -- interlayer --

Column 8, line 22: delete "in arranged" and insert -- is arranged --

Column 8, line 26: delete "and layer 62" and insert -- and a layer 62 --

Column 9, line 54: delete "post-processing an absorber" and insert -- post-processing of an absorber --

Column 10, lines 34-35: delete "such that the during" and insert -- such that during --

Column 10, line 39: delete "the ions has" and insert -- the ions have --

Column 10, line 60: delete "arranged in such that" and insert -- arranged such that --

In the Claims:

Column 13, line 42: In Claim 24, delete "at least" and insert -- at at least --

Column 14, line 38: In Claim 31, delete "according" and insert -- according to --

Column 16, line 16: In Claim 41, delete "at least" and insert -- at at least --

Signed and Sealed this
Thirtieth Day of April, 2013

Teresa Stanek Rea
*Acting Director of the United States Patent and Trademark Office*